United States Patent
Kim et al.

(10) Patent No.: US 9,786,817 B2
(45) Date of Patent: Oct. 10, 2017

(54) SEMICONDUCTOR LIGHT EMITTING DEVICE

(71) Applicant: SAMSUNG ELECTRONICS CO., LTD., Suwon-si (KR)

(72) Inventors: Sung Joon Kim, Seoul (KR); Young Ho Ryu, Suwon-si (KR); Min Wook Choi, Gimpo-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/092,695

(22) Filed: Apr. 7, 2016

(65) Prior Publication Data
US 2017/0077353 A1    Mar. 16, 2017

(30) Foreign Application Priority Data
Sep. 10, 2015    (KR) ........................ 10-2015-0128351

(51) Int. Cl.
| | |
|---|---|
| H01L 33/38 | (2010.01) |
| H01L 33/06 | (2010.01) |
| H01L 33/32 | (2010.01) |
| H01L 33/42 | (2010.01) |
| H01L 33/14 | (2010.01) |

(52) U.S. Cl.
CPC ............ *H01L 33/382* (2013.01); *H01L 33/06* (2013.01); *H01L 33/145* (2013.01); *H01L 33/32* (2013.01); *H01L 33/42* (2013.01)

(58) Field of Classification Search
CPC ...... H01L 33/06; H01L 33/382; H01L 33/145
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

| | | |
|---|---|---|
| KR | 10-1340322 B1 | 12/2013 |
| KR | 10-2014-0085946 A | 7/2014 |
| KR | 10-1455798 B1 | 11/2014 |

*Primary Examiner* — Matthew Reames
(74) *Attorney, Agent, or Firm* — Sughrue Mion, PLLC

(57) ABSTRACT

A semiconductor light emitting device includes a semiconductor stack including a first conductive semiconductor layer including a first surface, a second conductive semiconductor layer including a second surface opposite to the first surface, an active layer disposed between the first conductive semiconductor layer and the second conductive semiconductor layer, and a through hole disposed through the semiconductor stack. The semiconductor light emitting device further includes a contact layer connected to the first conductive semiconductor layer, disposed in the through hole, and disposed through the semiconductor stack, a first electrode layer connected to the contact layer, and a second electrode layer disposed on the second surface, and including a pad forming portion on which the semiconductor stack is not disposed. The semiconductor light emitting device further includes an insulating layer disposed between the first electrode layer and the second electrode layer, and an electrode pad disposed on the pad forming portion.

18 Claims, 8 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,867,800 B2 | 1/2011 | Manabe et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,211,721 B2 | 7/2012 | Lin et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,507,938 B2 | 8/2013 | Yu et al. |
| 8,536,604 B2 | 9/2013 | Kwak et al. |
| 8,735,931 B2 | 5/2014 | Han et al. |
| 8,766,295 B2 | 7/2014 | Kim |
| 2008/0315240 A1 | 12/2008 | Kim et al. |
| 2014/0061702 A1 | 3/2014 | Yamamoto et al. |
| 2015/0053915 A1* | 2/2015 | Huang .............. H01L 33/60 257/13 |
| 2015/0053995 A1 | 2/2015 | Bae et al. |

* cited by examiner

SEMICONDUCTOR LIGHT EMITTING DEVICE

CROSS-REFERENCE TO RELATED APPLICATION

This application claims priority from Korean Patent Application No. 10-2015-0128351, filed on Sep. 10, 2015, in the Korean Intellectual Property Office, the disclosure of which is incorporated herein by reference in its entirety.

BACKGROUND

1. Field

Apparatuses and methods consistent with example embodiments relate to a semiconductor light emitting device.

2. Description of the Related Art

A semiconductor light emitting device may have low power consumption, a relatively long lifespan, and the ability to implement light having various colors as compared to light sources of the related art, such as a fluorescent lamp and an incandescent lamp. As such, the application of semiconductor light emitting devices is being expanded into new fields, such as various types of lighting devices, the backlights of display devices, and vehicle headlamps.

The luminous efficiency of a semiconductor light emitting device may be affected by a flow of current in the semiconductor light emitting device. For example, in a case in which an electric current does not evenly flow or current crowding occurs in a semiconductor light emitting device, the luminous efficiency of the semiconductor light emitting device may be reduced.

However, semiconductor light emitting devices of the related art may have a structure in which an electric current flows in a horizontal direction with respect to an active layer to cause current crowding, thereby reducing the luminous efficiency thereof.

SUMMARY

One or more example embodiments provide a semiconductor light emitting device that can improve luminous efficiency thereof by allowing an electric current to flow in a vertical direction with respect to an active layer.

According to example embodiments, a semiconductor light emitting device includes a semiconductor stack including a first conductive semiconductor layer including a first surface, a second conductive semiconductor layer including a second surface opposite to the first surface, an active layer disposed between the first conductive semiconductor layer and the second conductive semiconductor layer, and a through hole disposed through the semiconductor stack. The semiconductor light emitting device further includes a contact layer connected to the first conductive semiconductor layer, disposed in the through hole, and disposed through the semiconductor stack, a first electrode layer connected to the contact layer, and a second electrode layer disposed on the second surface, and including a pad forming portion on which the semiconductor stack is not disposed. The semiconductor light emitting device further includes an insulating layer disposed between the first electrode layer and the second electrode layer, and an electrode pad disposed on the pad forming portion.

The contact layer may be disposed on the first surface.

The semiconductor light emitting device may further include a transparent electrode connected to the contact layer, and disposed on the first surface.

The semiconductor light emitting device may further include a current blocking layer disposed between the second conductive semiconductor layer and the second electrode layer, and in a region surrounding the through hole.

The semiconductor light emitting device may further include a side wall insulating film disposed on a side wall of the through hole to insulate the contact layer from the second conductive semiconductor layer and the active layer.

The side wall insulating film may be disposed on a substantially entire region of the side wall.

The semiconductor light emitting device may further include a conductive substrate disposed on the first electrode layer.

The through hole may have a first width at the first surface, and a second width at the second surface, the second width being narrower than the first width.

The second conductive semiconductor layer may further include an uneven portion disposed on the second surface.

The electrode pad may be disposed adjacent to an edge of the semiconductor stack.

According to example embodiments, a semiconductor light emitting device includes a semiconductor stack including a first conductive semiconductor layer including a first surface, a second conductive semiconductor layer including a second surface opposite to the first surface, an active layer disposed between the first conductive semiconductor layer and the second conductive semiconductor layer, and a through hole disposed through the semiconductor stack. The semiconductor light emitting device further includes a contact layer connected to the first conductive semiconductor layer, disposed in the through hole, and disposed through the semiconductor stack, a first electrode layer connected to the contact layer, and a second electrode layer disposed on the second surface, and insulated from the first electrode layer.

The semiconductor light emitting device further includes a side wall insulating film disposed on a side wall of the through hole to insulate the contact layer from the second conductive semiconductor layer and the active layer, and the contact layer may be disposed on the side wall and on the first surface.

The semiconductor light emitting device further includes a transparent electrode connected to the contact layer, and disposed on a substantially entire region of the first surface.

The second electrode layer may include a pad forming portion extending from the semiconductor stack, and on which the semiconductor stack is not disposed, and the semiconductor light emitting device may further include an electrode pad disposed on the pad forming portion.

The through hole may include a plurality of through holes.

According to example embodiments, a semiconductor light emitting device includes a first electrode layer, an insulating layer disposed on the first electrode layer, a second electrode layer disposed on the insulating layer, a first conductive layer, a second conductive layer disposed on the second electrode layer, and an active layer disposed between the first conductive layer and the second conductive layer. The semiconductor light emitting device further includes a through hole disposed through the first conductive layer, the active layer, the second conductive layer, the second electrode layer, and the insulating layer, and a contact layer disposed in the through hole to the first electrode layer.

The through hole may have a first width at the first surface, and a second width at the first electrode layer, the second width being narrower than the first width.

The contact layer may be disposed on a portion of the first surface.

The semiconductor light emitting device may further include an insulating film disposed on a side wall of the through hole to the insulating layer, and the contact layer may be disposed on the insulating film.

The second electrode layer may include a portion on which the second conductive layer, the active layer, and the first conductive layer are not disposed, and the semiconductor light emitting device may further include a pad disposed on the portion.

BRIEF DESCRIPTION OF THE DRAWINGS

The above and/or other aspects will be more apparent by describing example embodiments with reference to the accompanying drawings.

DETAILED DESCRIPTION

Figure 1:
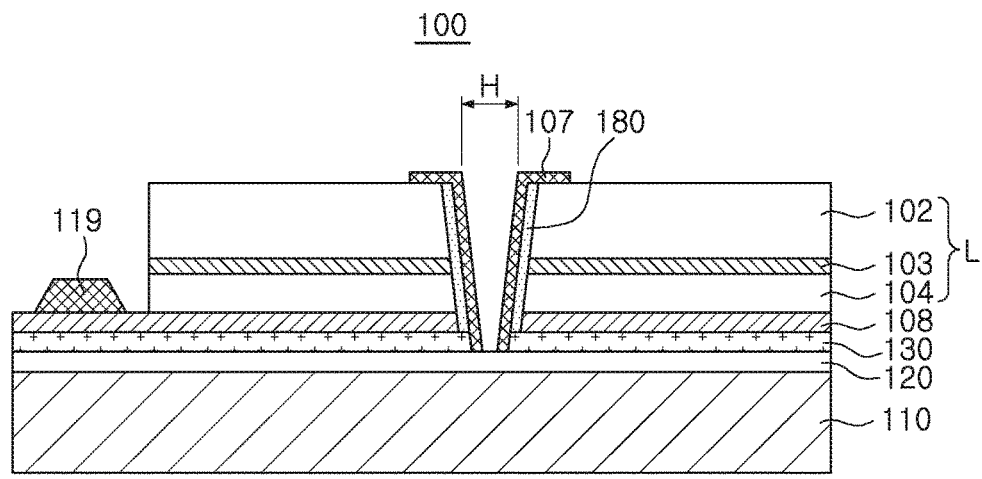
FIG. 1 is a cross-sectional view of a semiconductor light emitting device according to an example embodiment.

Hereinafter, example embodiments will be described as follows with reference to the attached drawings.

The present disclosure may, however, be exemplified in many different forms and may not be construed as being limited to the example embodiments set forth herein. Rather, these example embodiments are provided so that this disclosure will be thorough and complete, and will fully convey the scope of the disclosure to those skilled in the art.

Throughout the specification, it will be understood that when an element, such as a layer, region or substrate, is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections may not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a direction of the figures. The device may be otherwise oriented (rotated 90 degrees or at other orientations) and the spatially relative descriptors used herein may be interpreted accordingly.

The terminology used herein is for describing example embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, example embodiments will be described with reference to schematic views illustrating example embodiments. In the drawings, for example, due to manufacturing techniques and/or tolerances, modifications of the shape shown may be estimated. Thus, example embodiments may not be construed as being limited to the shapes of regions shown herein, for example, to include a change in shape results in manufacturing. The following example embodiments may also be constituted as one or a combination thereof.

The contents described below may have a variety of configurations and propose only an example configuration herein, but are not limited thereto.

FIG. 1 is a cross-sectional view of a semiconductor light emitting device according to an example embodiment.

Referring to FIG. 1, a semiconductor light emitting device 100 according to an example embodiment includes a semiconductor stack L, a contact layer 107, a second electrode layer 108, a conductive substrate 110, an electrode pad 119, a first electrode layer 120, and an insulating layer 130.

The semiconductor stack L includes a first conductive semiconductor layer 102 and a second conductive semiconductor layer 104 having a first surface and a second surface opposing each other, respectively, an active layer 103 disposed between the first and second conductive semiconductor layers 102 and 104, and at least one through hole H connecting the first surface to the second surface.

The first and second conductive semiconductor layers 102 and 104 may include semiconductors doped with n- and p-type impurities, respectively. The first and second conductive semiconductor layers 102 and 104 may not be limited thereto, but may be p- and n-type semiconductor layers, respectively. For example, the first and second conductive semiconductor layers 102 and 104 may include a group III nitride semiconductor layer, such as a material having a composition of $Al_xIn_yGa_{1-x-y}N$ ($0 \leq x \leq 1$, $0 \leq y \leq 1$, $0 \leq x+y \leq 1$). The first and second conductive semiconductor layers 102 and 104 may not be limited thereto, and may also be formed using a material such as an AlGaInP-based semiconductor or an AlGaAs-based semiconductor.

For example, the first conductive semiconductor layer 102 may be an n-type gallium nitride (GaN), and the second conductive semiconductor layer 104 may be a p-type GaN.

The first and second conductive semiconductor layers 102 and 104 may include a monolayer structure, but may have a multilayer structure having different compositions or thicknesses. For example, each of the first and second conductive semiconductor layers 102 and 104 may include a carrier injection layer improving injection efficiency of electrons and holes, and may also include various forms of superlattice structures.

The first and second conductive semiconductor layers 102 and 104 have the active layer 103 disposed therebetween. For example, the active layer 103 may have a multiple quantum well (MQW) structure in which quantum well layers and quantum barrier layers are alternately stacked on each other. For example, in a case of a nitride semiconductor, the active layer 13 may have a GaN/InGaN structure, and may also have a single quantum well (SQW) structure. Accordingly, the active layer 103 may provide a space in which electrons and holes flowing between the first and second conductive semiconductor layers 102 and 104 may be recombined with each other to emit light.

For example, the first conductive semiconductor layer 102 may further include a current diffusion layer on a portion thereof adjacent to the active layer 103. The current diffusion layer may have a structure in which a plurality of layers having different compositions, $In_xAl_yGa_{(1-x-y)}N$, or different impurity contents are repeatedly stacked, or may have an insulating material layer partially formed thereon.

For example, the second conductive semiconductor layer 104 may further include an electron blocking layer in a portion thereof adjacent to the active layer 103. The electron blocking layer may have a structure in which a plurality of layers including different compositions, $In_xAl_yGa_{(1-x-y)}N$, are stacked, or at least one layer including a composition of $Al_yGa_{(1-y)}N$, and may prevent electrons from moving to the second conductive semiconductor layer 104 due to having a band gap higher than that of the active layer 103.

In an example embodiment, the first and second conductive semiconductor layers 102 and 104 and the active layer 103 may be produced by using a metal organic chemical vapor deposition (MOCVD) apparatus. To produce the first and second conductive semiconductor layers 102 and 104 and the active layer 103, organic metal compound gas (for example, trimethyl gallium (TMG), trimethyl aluminum (TMA), and the like) and nitrogen-containing gas (ammonia ($NH_3$) or the like) as reaction gases may be supplied to a reaction vessel in which the conductive substrate 110 is installed. The conductive substrate 110 may remain heated at a high temperature within a range of 900° C. to 1100° C. Impurity gas may be supplied while a nitride gallium-based compound semiconductor layer is grown on the conductive substrate 110. The nitride gallium-based compound semiconductor may thus be stacked as an undoped type, an n-type, or a p-type. Si is well-known as an n-type impurity, Zn, Cd, Be, Mg, Ca, Ba, and the like are provided as p-type impurities, and Mg and Zn may be mainly used as p-type impurities.

The contact layer 107 may be understood to be an extension electrode disposed in the at least one through hole H and connected to the first electrode layer 120. The contact layer 107 is positioned above the first surface of the semiconductor stack L to be linked to the first conductive semiconductor layer 102.

As illustrated in FIG. 1, the contact layer 107 has a portion extending to the first surface of the semiconductor stack L to be connected to the first conductive semiconductor layer 102. Accordingly, the contact layer 107 has a contact portion connected to a portion of an upper surface of the first conductive semiconductor layer 102, thereby ensuring that an electric current is distributed in a horizontal direction in comparison to a contact portion confined in the at least one through hole H.

In more detail, if the at least one through hole H is not penetrated and the contact layer 107 contacts the first conductive semiconductor layer 102 only in the at least one through hole H, current crowding may occur in the first conductive semiconductor layer 102 around the at least one through hole H, thereby decreasing luminous efficiency of the semiconductor light emitting device 100.

The semiconductor light emitting device 100 according to the example embodiments has, however, the contact portion disposed on the upper surface of the first conductive semiconductor layer 102 outside the at least one through hole H, thereby reducing current crowding and increasing the luminous efficiency.

The contact layer 107 is also electrically connected from a portion of the first conductive semiconductor layer 102 to a portion of the first electrode layer 120. For example, the contact layer 107 may cover etching surfaces of the active layer 103, the first conductive semiconductor layer 102, and the second conductive semiconductor layer 104, and may include at least one among Al, Ti, and Ag. Accordingly, the contact layer 107 may reflect light on surfaces of the active layer 103, the first conductive semiconductor layer 102, and the second conductive semiconductor layer 104. For instance, light emitted by the active layer 103 may be reflected by the contact layer 107 to be emitted from the first conductive semiconductor layer 102. As a result, the semiconductor light emitting device 100 according to an example embodiment may further improve the luminous efficiency.

In addition, a side wall insulating film 180 is disposed between the contact layer 107 and the semiconductor stack L. Accordingly, an angle of an electric current flowing through the contact layer 107 may be close to vertical.

For example, the conductive substrate 110 may include at least one among Au, Ni, Cu, and Sn, and is disposed on a lower surface of the first electrode layer 120.

For example, an unevenness structure may be formed at an interface between the first electrode layer 120 and the semiconductor stack L. The unevenness structure may allow a path of light emitted by the active layer 103 to vary. Thus, a rate at which light is absorbed by a semiconductor layer may be reduced, and a light scattering ratio may be increased, resulting in improved light extraction efficiency.

In addition, a buffer layer may be provided between the first electrode layer 120 and the semiconductor stack L.

The second conductive semiconductor layer 104 and the first electrode layer 120 also have the insulating layer 130 disposed therebetween. The insulating layer 130 is connected to the side wall insulating film 180. The insulating layer 130 may be formed using any material having electrically insulating characteristics, but may be formed using a material having low light absorption to prevent extraction efficiency of light emitted by the active layer 103 from deteriorating. For example, the insulating layer 130 may be formed with a silicon oxide or a silicon nitride, such as $SiO_2$, $SiO_xN_y$, or $Si_xN_y$. A light-reflective structure may be formed by dispersing a light-reflective filler in a light transmitting material.

The insulating layer 130 and the second conductive semiconductor layer 104 also have the second electrode layer 108 disposed therebetween. A portion of the second electrode layer 108 may be exposed externally through mesa etching. The portion of the second electrode layer 108 externally exposed has the electrode pad 119 disposed thereon. The electrode pad 119 may be electrically connected to a circuit pattern of a circuit board by a wire or the like. This may allow an electric current to stably flow from the second conductive semiconductor layer 104 to the electrode pad 119.

Figure 2:
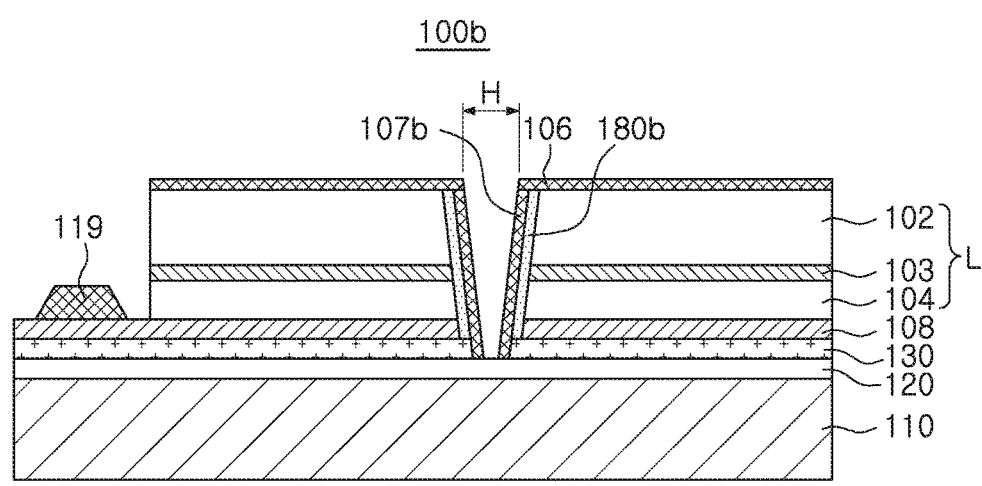
FIG. 2 is a cross-sectional view of a semiconductor light emitting device including a transparent electrode, according to an example embodiment.

FIG. 2 is a cross-sectional view of a semiconductor light emitting device including a transparent electrode, according to an example embodiment.

Referring to FIG. 2, a semiconductor light emitting device 100b includes a transparent electrode 106 electrically connected to a contact layer 107b on the second conductive semiconductor layer 102.

The transparent electrode 106 may allow an electric current flowing through the contact layer 107b to better spread in the first conductive semiconductor layer 102 in a horizontal direction. Accordingly, luminous efficiency of the semiconductor light emitting device 100b may be further increased.

For example, the transparent electrode 106 may include a material such as transparent and electrically conductive indium tin oxide (ITO), indium zinc oxide (IZO), zinc oxide (ZnO), carbon nanotubes (CNTs), or graphene. In other words, to externally spread light emitted by a semiconductor stack L, the transparent electrode 106 may include a material having high transmittance.

For example, the transparent electrode 106 may be implemented in a form of a finger having one end connected to the contact layer 107b. The transparent electrode 106 may also be disposed on a substantially entire portion of the first conductive semiconductor layer 102, on which the contact layer 107b is not disposed. A side wall insulating film 180b is extended to an upper surface of the first conductive semiconductor layer 102.

Figure 3:
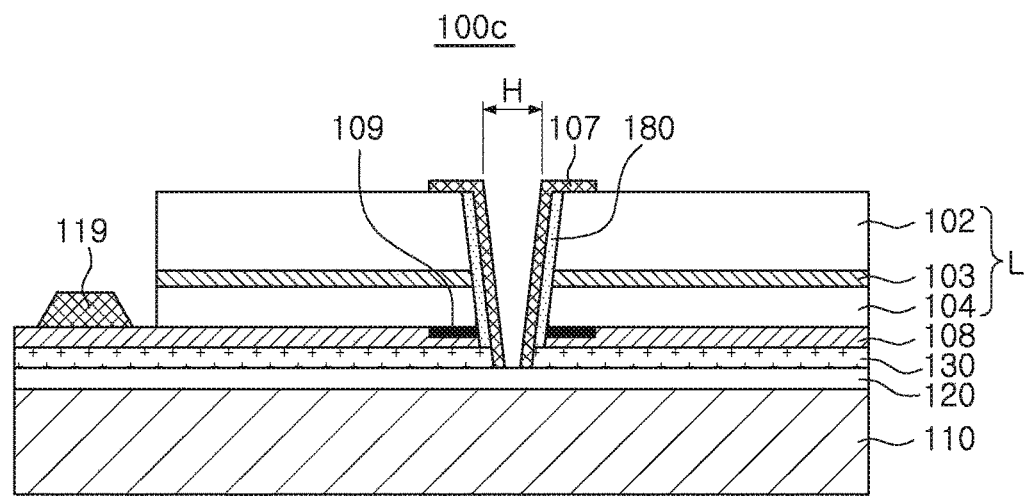
FIG. 3 is a cross-sectional view of a semiconductor light emitting device including a current blocking layer, according to an example embodiment.

FIG. 3 is a cross-sectional view of a semiconductor light emitting device including a current blocking layer, according to an example embodiment.

Referring to FIG. 3, a semiconductor light emitting device 100c includes a current blocking layer 109 disposed between the conductive substrate 110 and the second conductive semiconductor layer 104.

The current blocking layer 109 may allow an electric current flowing through a contact layer 107 to better spread in the first conductive semiconductor layer 102 in a horizontal direction. Accordingly, luminous efficiency of the semiconductor light emitting device 100c may be further increased.

For example, the current blocking layer 109 may be disposed in a position in which the current blocking layer 109 overlaps the contact layer 107 as viewed from above, and may be implemented of an insulating material such as $SiO_x$ or $SiN_x$.

For example, the current blocking layer 109 is disposed on the second surface of the semiconductor stack L to have an uneven shape. Here, the current blocking layer 109 is disposed on the second conductive semiconductor layer 104 to be uneven for the second electrode layer 108.

Figure 4:
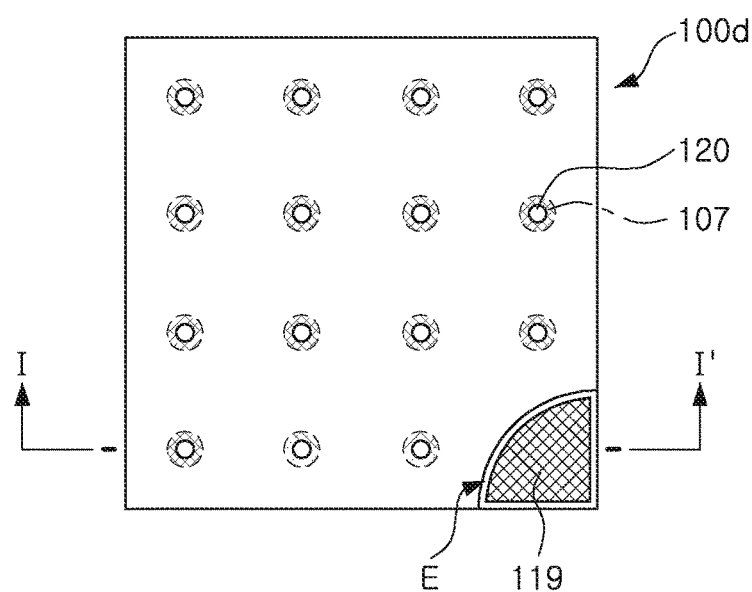
FIG. 4 is a plan view of a semiconductor light emitting device according to an example embodiment.
Figure 5:
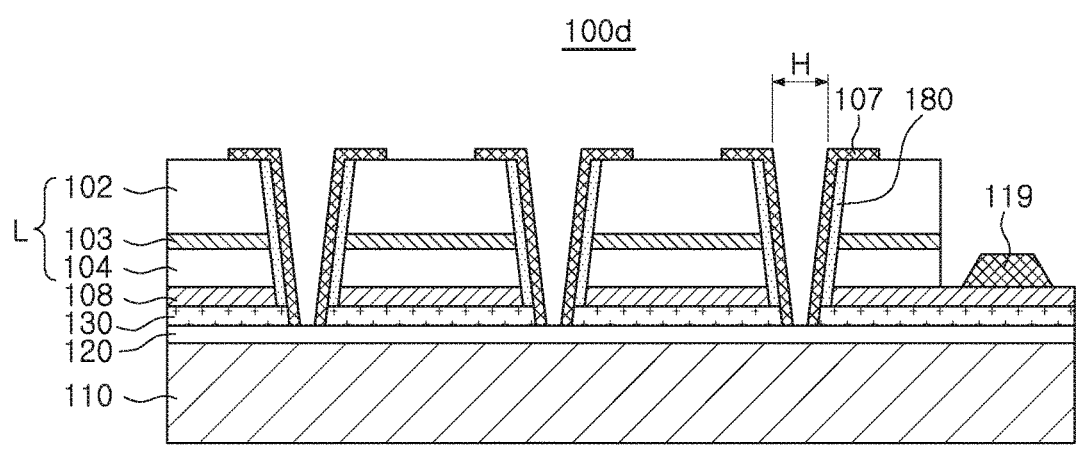
FIG. 5 is a cross-sectional view of the semiconductor light emitting device of FIG. 4.

FIG. 4 is a plan view of a semiconductor light emitting device according to an example embodiment, and FIG. 5 is a cross-sectional view of the semiconductor light emitting device of FIG. 4. Here, FIG. 5 is the cross-sectional view taken along line I-I' of FIG. 4.

Referring to FIGS. 4 and 5, a semiconductor light emitting device 100d according to an example embodiment includes the first conductive semiconductor layer 102, the active layer 103, the second conductive semiconductor layer 104, a plurality of contact layers 107, the second electrode layer 108, the conductive substrate 110, the electrode pad 119, the first electrode layer 120, the insulating layer 130, and the side wall insulating film 180.

The first electrode layer 120 may include an electrically conductive material. For example, the first electrode layer 120 may be a metallic substrate including any one among Au, Ni, Cu, and W, or a semiconductor substrate including any one among Si, Ge, GaN, and GaAs. The first electrode layer 120 has the insulating layer 130 and the second electrode layer 108 disposed thereon to be sequentially stacked on each other.

The second electrode layer 108 is disposed to be connected to the second conductive semiconductor layer 104. The second electrode layer 108 has the first conductive semiconductor layer 102, the active layer 103, and the second conductive semiconductor layer 104 disposed thereon to be sequentially stacked on one another.

The second electrode layer 108, the first conductive semiconductor layer 102, the active layer 103, and the second conductive semiconductor layer 104 may have a plurality of predetermined etched portions thereof. Side wall insulating films 180 may be disposed on surfaces of the plurality of etched portions, respectively. The side wall insulating films 180 have the contact layers 107 disposed thereon, respectively. Here, the contact layers 107 are electrically connected to the first electrode layer 120. This allows the first electrode layer 120 and an upper surface of the first conductive semiconductor layer 102 to be electrically connected to each other.

The second electrode layer 108 and the first electrode layer 120 have the insulating layer 130 disposed therebetween. As illustrated in FIG. 5, the insulating layer 130 is disposed between the second electrode layer 108 and the first electrode layer 120, and is connected to the side wall insulating films 180. This may allow leakage of an electric current flowing from the first electrode layer 120 to the upper surface of the first conductive semiconductor layer 102 to be prevented.

For example, the contact layers 107 may be formed by forming the side wall insulating films 180, exposing portions of the first conductive semiconductor layer 102, applying inert gas plasma treatment as a first plasma treatment, and using oxygen-containing gas plasma treatment as a second plasma treatment. This process may allow the electrode pad 119 to also be formed.

The second electrode layer 108 includes a portion that does not contact the second conductive semiconductor layer 104 to be externally exposed as illustrated in FIG. 5. The second electrode layer 108 includes at least one exposed portion E. The exposed portion E has the electrode pad 119 disposed thereon to connect an external power source to the second electrode layer 108.

The exposed portion E may be formed on an edge of a side of the semiconductor light emitting device 100d according to an example embodiment to significantly increase a light emitting region thereof as illustrated in FIG. 5. The second electrode layer 108 may be formed using a material having high reflectivity while making ohmic contact with the second conductive semiconductor layer 104. The second electrode layer 108 may include at least one metallic material such as Ag, Al, and Pt.

FIGS. 6A, 6B, 6C, 6D, and 6E are cross-sectional views illustrating a method of manufacturing a semiconductor light emitting device, according to an example embodiment.

Figure 6A:
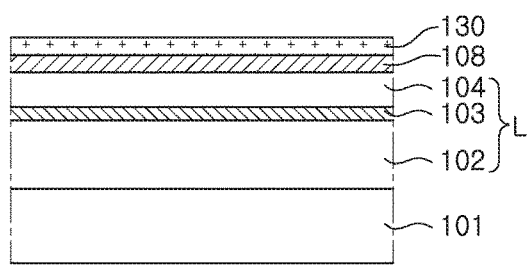
FIGS. 6A, 6B, 6C, 6D, and 6E are cross-sectional views illustrating a method of manufacturing a semiconductor light emitting device, according to an example embodiment.

As illustrated in FIG. 6A, a nitride stack L is prepared by sequentially growing the first conductive semiconductor layer 102, the active layer 103, and the second conductive semiconductor layer 104 on a conductive substrate 101. The second electrode layer 108 and the insulating layer 130 are additionally stacked on the nitride stack L.

A process of growing the nitride stack L may be performed using, for example, metal organic chemical vapor deposition (MOCVD) or molecular beam epitaxy (MBE). The nitride stack L may be a group III nitride semiconductor layer having a composition of $Al_xGa_yIn_{(1-x-y)}N$ ($0 \leq x \leq 1$, $0 \leq y \leq 1$, $0 \leq x+y \leq 1$). The conductive substrate 101 growing a nitride semiconductor layer may be used with sapphire, SiC, Si, GaN, $MgAl_2O_4$, MgO, $LiAlO_2$, or LiGaO.

Next, the conductive substrate 110 may be bonded to the nitride stack L. As in the example embodiments, the bonding may be implemented using a bonding metal. For example, the conductive substrate 110 may be a Si substrate or a Si—Al alloy substrate.

Figure 6B:
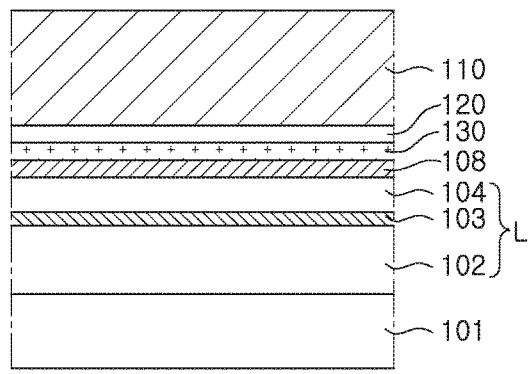

In the example embodiments, referring to FIG. 6B, a first bonding metal layer may be formed on the second conductive semiconductor layer 104 or the insulating layer 130, and a second bonding metal layer may be formed on a bonding surface of the conductive substrate 110. The first and second bonding metal layers may include a metal or an alloy selected from the group consisting of Ni, Pt, Au, Cu Sn, In, Zn, Bi, Au, or Co, and combinations thereof.

The conductive substrate 110 may be disposed on the second conductive semiconductor layer 104 or the insulating layer 130 in such a manner that the first and second bonding metal layers may be opposed to each other. Heat may be applied to the conductive substrate 110 and the second conductive semiconductor layer 104 so that the first and second bonding metal layers may be melted, resulting in forming a eutectic metal bonding layer EM or the first electrode layer 120. This may allow the conductive substrate 110 (permanent substrate) and the nitride stack L to be bonded to each other.

Figure 6C:
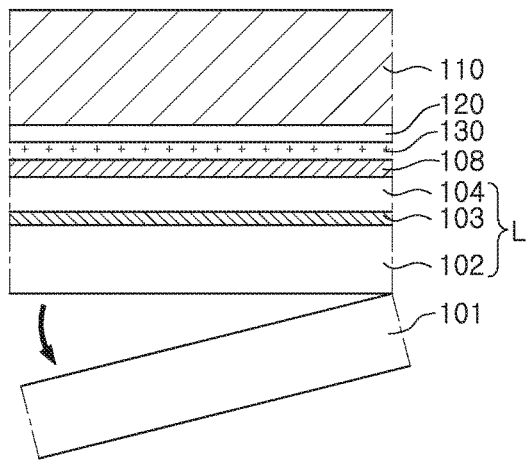

Next, as illustrated in FIG. 6C, the conductive substrate 101 is separated from the nitride stack L by radiating a laser beam to an interface between the conductive substrate 101 and the first conductive semiconductor layer 102.

Figure 6D:
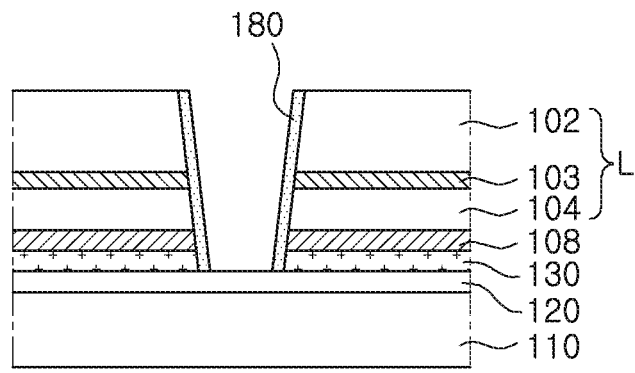

Subsequently, as illustrated in FIG. 6D, a through hole is formed (e.g., by etching) through the nitride stack L, the second electrode layer 108, and the insulating layer 130, and a side wall insulating film 180 is formed on a surface of the nitride stack L, the surface being formed by the through hole. For example, the side wall insulating film 180 may be formed by oxygen-containing gas plasma treatment. The side wall insulating film 180 may be used as a tunneling layer ensuring ohmic contact when an n-type electrode is formed.

In a case in which the first conductive semiconductor layer 102 is an n-type GaN layer, the side wall insulating film 180 including oxygen may be oxy-nitriding gallium, and such oxy-nitriding gallium may be represented as $GaO_xN_{1-x}$ ($0<x<0.5$).

Figure 6E:
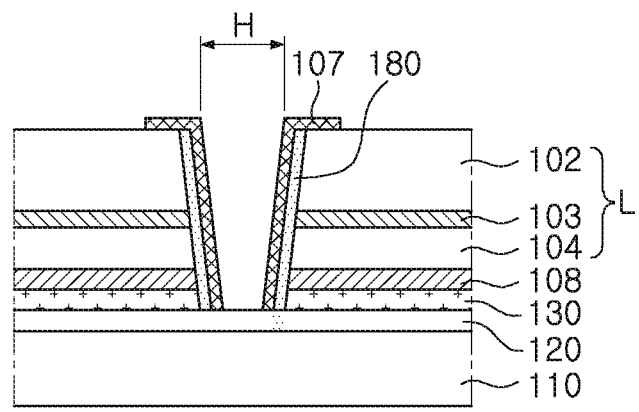

Next, as illustrated in FIG. 6E, a contact layer 107 is formed on the side wall insulating film 180.

The contact layer 107 may be in ohmic contact with the first conductive semiconductor layer 102 with a tunneling effect caused by the side wall insulating film 180 to which oxygen is added. The contact layer 107 is not limited to Al and Ag, and may be implemented of at least one metal selected from the group consisting of Ni, Rh, Pd, Ir, Ru, Mg, Zn, Pt, Au, Cr, or Ti. An additional thermal treatment process that may damage a surface of the nitride semiconductor layer may also be omitted.

The method of manufacturing a semiconductor light emitting device illustrated in FIG. 6E may prevent a step from being generated due to the formation of the contact layer 107. Accordingly, stability of the manufactured semiconductor light emitting device may be increased. In addition, margin design preventing short circuits between the second conductive semiconductor layer 104 and the first conductive semiconductor layer 102 may be relatively less performed. As a result, the manufactured semiconductor light emitting device may provide room for the formation of the contact layer 107, thereby implementing various forms of electrodes.

Figure 7:
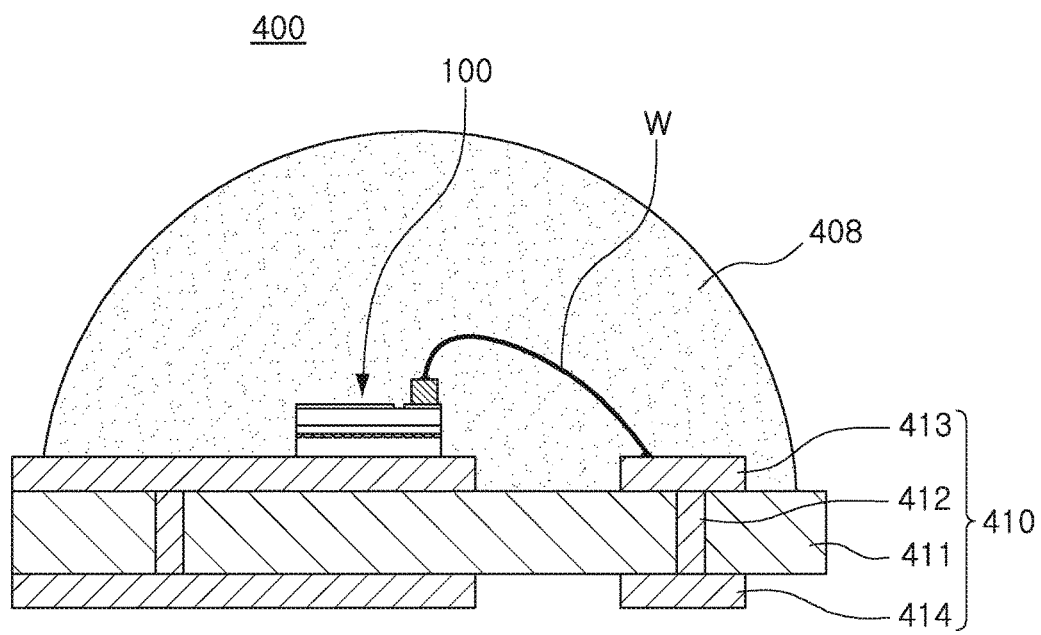
FIG. 7 is a cross-sectional view of a semiconductor light emitting device package including a semiconductor light emitting device according to an example embodiment.

FIG. 7 is a cross-sectional view of a semiconductor light emitting device package including a semiconductor light emitting device according to an example embodiment.

A semiconductor light emitting device package 400 illustrated in FIG. 7 includes the semiconductor light emitting device 100, a mounting substrate 410, and an encapsulant 408. The semiconductor light emitting device 100 is disposed on the mounting substrate 410 and is electrically connected to the mounting substrate 410 by a wire W. The mounting substrate 410 includes a substrate body 411, an upper electrode 413, a lower electrode 414, and a through electrode 412 connecting the upper electrode 413 to the lower electrode 414. The mounting substrate 410 may be provided as a substrate such as a printed circuit board (PCB), a metal core printed circuit board (MCPCB), a metal printed circuit board (MPCB), or a flexible printed circuit board (FPCB), and a structure of the mounting substrate 410 may be applied in various forms.

The encapsulant 408 has a dome-shaped lens structure having an upper convex surface, and may adjust an orientation angle of light emitted by introducing a different structure.

The encapsulant 408 may include a wavelength conversion material such as a phosphor and/or a quantum dot. Such a wavelength conversion material may be formed by using various kinds of materials, such as a phosphor and/or a quantum dot.

A phosphor may have the following formulae and colors: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); green β-SiAlON:Eu, yellow $La_3Si_6N_{11}$:Ce, orange α-SiAlON:Eu, red $CaAlSiN_3$:Eu, red $Sr_2Si_5N_8$:Eu, red $SrSiAl_4N_7$:Eu, and red $SrLiAl_3N_4$:Eu (nitride-based), $Ln_{4-x}(Eu_zM_{1-z})_xSi_{12-y}Al_yO_{3+x+y}N_{18-x-y}$ ($0.5 \leq x \leq 3$, $0<z<0.3$, $0<y \leq 4$)—Formula (1), in which Ln may be at least one type of element selected from the group consisting of group IIIa elements and rare earth elements, and M may be at least one type of element selected from the group consisting of Ca, Ba, Sr and Mg; and KSF-based red $K_2SiF_6:Mn_4^+$, KSF-based red $K_2TiF_6:Mn_4^+$, KSF-based red $NaYF_4:Mn_4^+$, and KSF-based red $NaGdF_4:Mn_4^+$ (fluoride-based).

In addition, a quantum dot (QD) may be used to replace a phosphor or to be mixed with a phosphor, as a wavelength conversion material. The QD may implement various colors according to sizes thereof, and for instance, when used as a phosphor substitute, the QD may be employed as a red or green phosphor. In a case of using a QD, a narrow full width at half maximum (for example, about 35 nm) may be implemented.

The wavelength conversion material may be implemented in a form included in an encapsulant. Alternately, the wavelength conversion material may be previously manufactured in a form of a film and may be attached to a surface of an optical structure, such as a semiconductor light emitting device or a light guide plate. In this case, the wavelength conversion material may be readily applied to a desired portion of a structure having a uniform thickness.

The wavelength conversion material may be used in various types of light source devices such as a backlight, a display device, and a lighting device.

Figure 8:
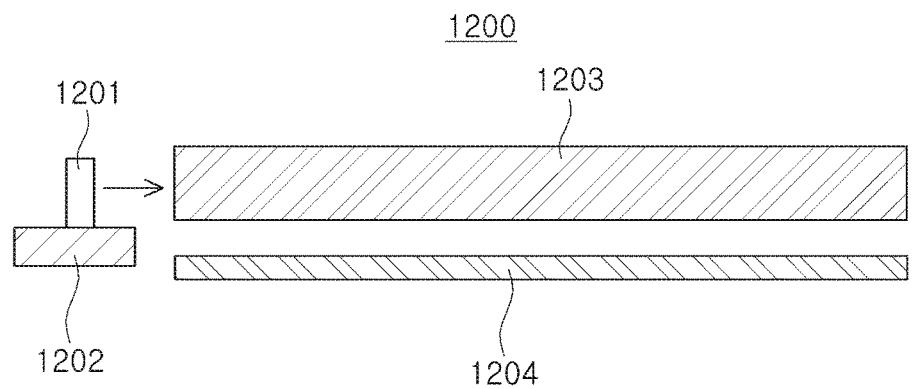
FIG. 8 is a cross-sectional view of a backlight including a semiconductor light emitting device according to an example embodiment.

FIG. 8 is a cross-sectional view of a backlight including a semiconductor light emitting device according to an example embodiment.

Referring to FIG. 8, a backlight 1200 includes a light guide plate 1203, and a circuit board 1202 disposed at a surface of the light guide plate 1203 and having a plurality of light sources 1201 mounted thereon. A reflective layer 1204 is disposed below the light guide plate 1203 of the backlight 1200.

The light sources 1201 may radiate light to a surface of the light guide plate 1203, and the light may be internally incident on the light guide plate 1203 to be reflected above the light guide plate 1203. The backlight 1200 according to the example embodiments may also be referred to as an "edge-type backlight." The light sources 1201 may include the aforementioned semiconductor light emitting device or the semiconductor light emitting device package including the semiconductor light emitting device together with a wavelength conversion material. For example, the light sources 1201 may be the semiconductor light emitting device package 400.

Figure 9:
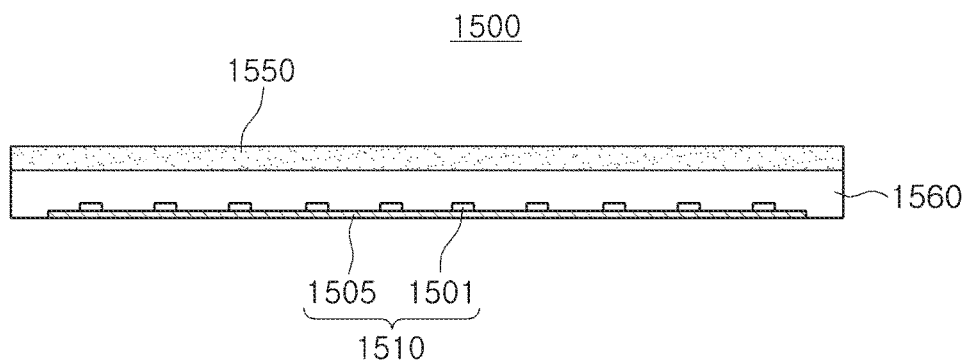
FIG. 9 is a cross-sectional view of a direct-type backlight including a semiconductor light emitting device according to an example embodiment.

FIG. 9 is a cross-sectional view of a direct-type backlight including a semiconductor light emitting device according to an example embodiment.

Referring to FIG. 9, a backlight 1500 as a direct-type backlight includes a wavelength converter 1550, a light source portion 1510 disposed below the wavelength converter 1550, and a bottom case 1560 accommodating the light source portion 1510. The light source portion 1510 includes a PCB 1505 and a plurality of light sources 1501 disposed on an upper surface of the PCB 1505. The light sources 1501 may be the aforementioned semiconductor light emitting device or the semiconductor light emitting device package including the same. The light sources 1501 may not be used with a wavelength conversion material.

The wavelength converter 1550 may be properly selected to emit white light according to wavelengths of the light sources 1501. The wavelength converter 1550 may be manufactured as a separate film, or may be provided in a form of being integrated with another optical element such as a separate light diffusion plate. As such, in the example embodiments, the wavelength converter 1550 may be disposed to be spaced apart from the light sources 1501, thereby reducing deterioration of reliability of the wavelength converter 1550 caused by heat emitted by the light sources 1501.

Figure 10:
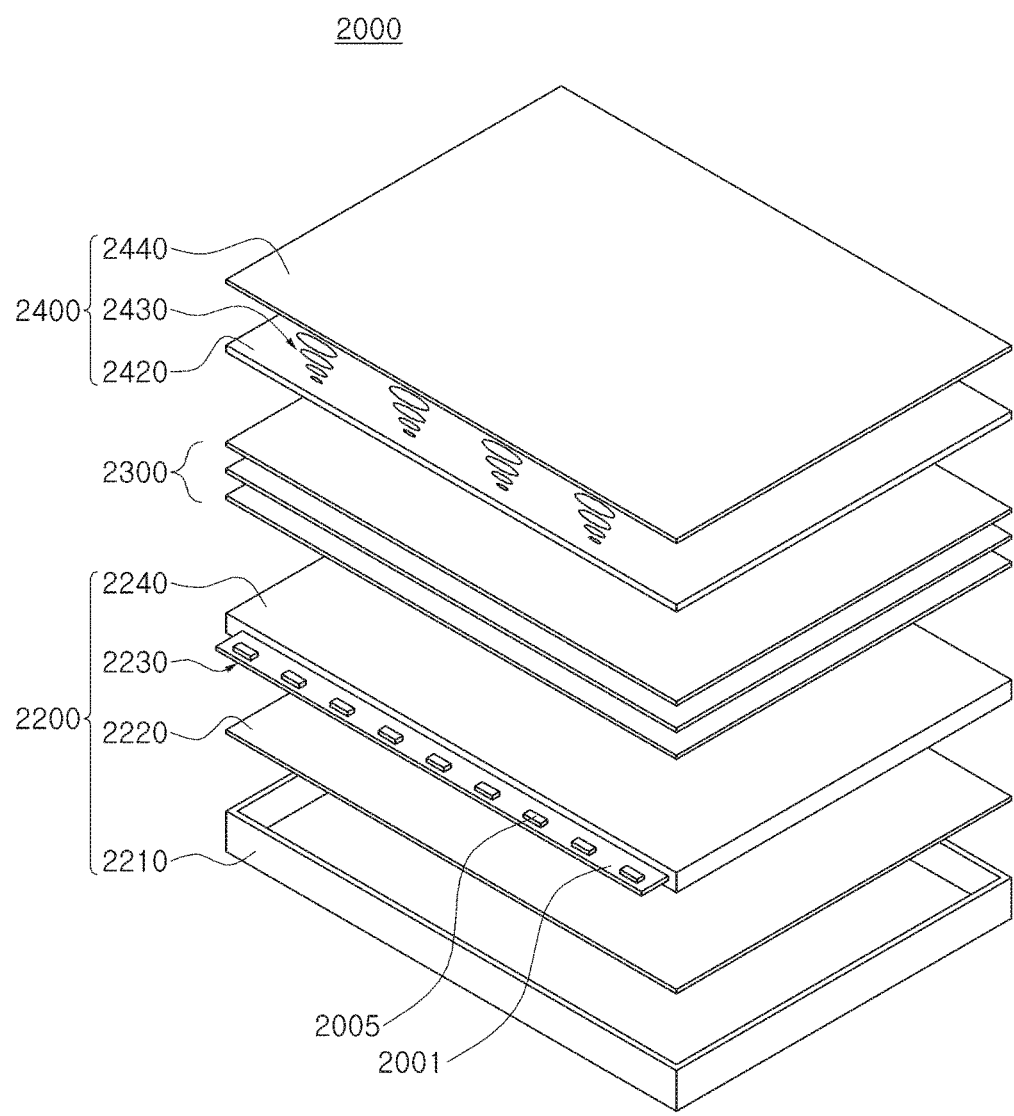
FIG. 10 is an exploded perspective view of a display device including a semiconductor light emitting device according to an example embodiment.

FIG. 10 is an exploded perspective view of a display device including a semiconductor light emitting device according to an example embodiment.

Referring to FIG. 10, a display device 2000 includes a backlight 2200, optical sheets 2300, and an image display panel 2400 such as a liquid crystal display panel.

The backlight 2200 includes a bottom case 2210, a reflector 2220, a light guide plate 2240, and a light source portion 2230 disposed on at least one surface of the light guide plate 2240. The light source portion 2230 includes a PCB 2001 and light sources 2005, and the light sources 2005 may be the aforementioned semiconductor light emitting device or the semiconductor light emitting device package including the same. The light sources 2005 implemented in the example embodiments may be a side view-type light emitting device disposed on a surface adjacent to a light emitting surface. According to an example embodiment, the backlight 2200 may be replaced by one among the backlights 1200 and 1500 respectively illustrated in FIGS. 8 and 9.

The optical sheets 2300 are disposed between the light guide plate 2240 and the image display panel 2400, and may include various kinds of sheets such as a diffusion sheet, a prism sheet, and a protection sheet.

The image display panel 2400 may display an image using light emitted through the optical sheets 2300. The image display panel 2400 includes an array substrate 2420, a liquid crystal layer 2430, and a color filter substrate 2440. The array substrate 2420 may include pixel electrodes disposed in a matrix, thin film transistors applying a driving voltage to the pixel electrodes, and signal lines operating the thin film transistors. The color filter substrate 2440 may include a transparent substrate, a color filter, and a common electrode. The color filter may include filters selectively passing light having a wavelength out of white light emitted by the backlight 2200. The liquid crystal layer 2430 may be re-arranged by an electric field generated between the pixel electrodes and the common electrode to adjust light transmittance. Light with adjusted light transmittance may be projected to display an image by passing through the color filter of the color filter substrate 2440. The image display panel 2400 may further include a driving circuit or the like processing an image signal.

Figure 11:
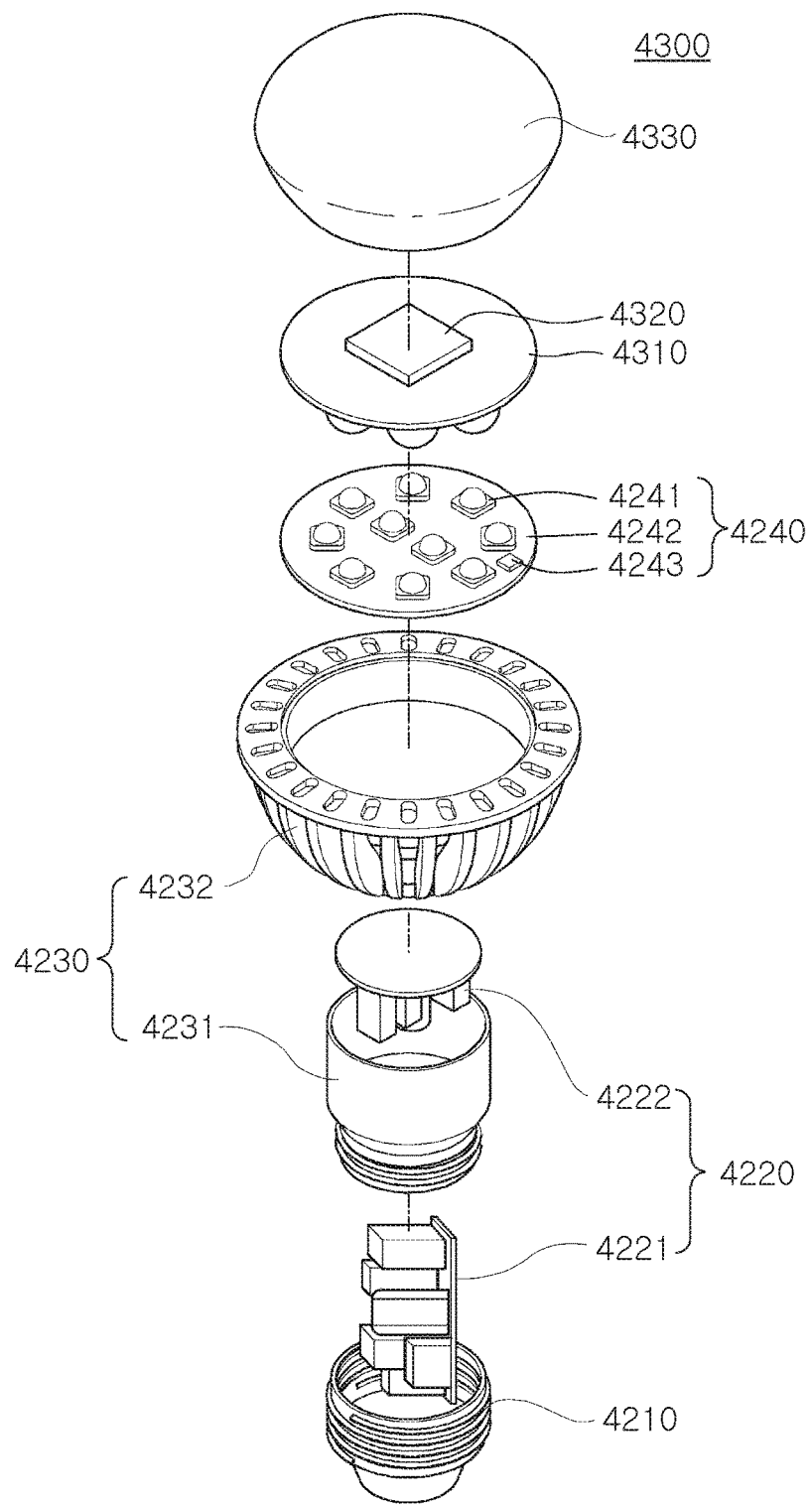
FIG. 11 is an exploded perspective view of a lighting device including a semiconductor light emitting device according to an example embodiment.

FIG. 11 is an exploded perspective view of a lighting device including a semiconductor light emitting device according to an example embodiment.

Referring to FIG. 11, a lighting device 4300 or a light emitting diode (LED) lamp includes a socket 4210, a power supply 4220, a heat sink 4230, and a light source portion 4240. According to an example embodiment, the light source portion 4240 may include a light emitting device array, and the power supply 4220 may include a light emitting device driver.

The socket 4210 may be configured to replace that of a lighting device of the related art. Power supplied to the lighting device 4300 may be applied through the socket 4210. As illustrated in FIG. 11, the power supply 4220 is separately attached with a first power supply 4221 and a second power supply 4222. The heat sink 4230 includes an internal heat sink 4231 and an external heat sink 4232. The internal heat sink 4231 may be directly connected to the light source portion 4240 and/or the power supply 4220. This may allow heat to be transferred to the external heat sink 4232.

The light source portion 4240 may receive power from the power supply 4220 to emit light to an optical device 4330. The light source portion 4240 includes light sources 4241, a circuit board 4242, and a controller 4243, and the controller 4243 may store driving information of the light sources 4241. The light sources 4241 may be the aforementioned semiconductor light emitting device or the semiconductor light emitting device package including the same.

A reflector 4310 is disposed above the light source portion 4240, and may reduce glare by evenly spreading light emitted by the light sources 4241 to a side and a rear of the reflector 4310. In addition, a communications chip 4320 is disposed on the reflector 4310, and may perform home network communications. For example, the communication chip 4320 may a wireless communications chip using Zigbee®, Wi-Fi, or light fidelity (Li-Fi), and may control on/off functions and brightness of a lighting apparatus installed in and around the home through a smartphone or wireless controller. Further, use of a Li-Fi communications chip using a visible light wavelength of a lighting device installed in and around residential, commercial, or industrial spaces may control electronics such as a TV, a refrigerator, an air-conditioner, a door lock, or may control a vehicle. The reflector 4310 and the communications chip 4320 are covered with the optical device 4330.

As set forth above, according to example embodiments, a semiconductor light emitting device may allow an electric current to flow in a vertical direction with respect to an active layer, thereby increasing luminous efficiency.

In addition, stability of the semiconductor light emitting device may be increased because a step is not created when a contact layer for the semiconductor light emitting device is formed, and the semiconductor light emitting device may perform less margin design preventing a short circuit between an n-type semiconductor layer and a p-type semiconductor layer.

Moreover, the semiconductor light emitting device may provide room for the formation of the contact layer, thereby implementing various forms of electrodes.

Although a few example embodiments have been shown and described, it would be appreciated by those skilled in the art that changes may be made in the example embodiments without departing from the principles and spirit of the disclosure, the scope of which is defined in the claims and their equivalents.

What is claimed is:

1. A semiconductor light emitting device comprising:
  a semiconductor stack comprising a first semiconductor layer of a first conductivity type, a second semiconductor layer of a second conductivity type opposite to the first conductivity type, an active layer disposed between the first semiconductor layer and the second semiconductor layer, and a through-hole disposed through the semiconductor stack, the semiconductor stack further comprising a first surface and a second surface opposite to the first surface;
  a contact layer connected to the first semiconductor layer, disposed in the through-hole, and disposed through the semiconductor stack;
  a first electrode layer connected to the contact layer;
  a second electrode layer disposed on the second surface of the semiconductor stack, disposed between the semiconductor stack and the first electrode layer, and comprising a pad forming portion on which the semiconductor stack is not disposed;
  an insulating layer disposed between the first electrode layer and the second electrode layer, the through-hole being disposed through the second electrode layer and the insulating layer; and
  an electrode pad disposed on the pad forming portion,
  wherein the through-hole has a first width at the first surface of the semiconductor stack, and a second width at the second surface of the semiconductor stack, the second width being narrower than the first width.

2. The semiconductor light emitting device of claim 1, wherein the contact layer is disposed on the first surface of the semiconductor stack.

3. The semiconductor light emitting device of claim 1, further comprising a transparent electrode connected to the contact layer, and disposed on the first surface of the semiconductor stack.

4. The semiconductor light emitting device of claim 1, further comprising a current blocking layer disposed between a first portion the second semiconductor layer and a second portion the second electrode layer.

5. The semiconductor light emitting device of claim 1, further comprising a side wall insulating film disposed on a side wall of the through-hole to insulate the contact layer from the second semiconductor layer and the active layer.

6. The semiconductor light emitting device of claim 5, wherein the side wall insulating film is disposed on a substantially entire region of the side wall.

7. The semiconductor light emitting device of claim 1, further comprising a conductive substrate disposed on the first electrode layer.

8. The semiconductor light emitting device of claim 1, wherein the second semiconductor layer further comprises an uneven portion disposed on the second surface of the semiconductor stack.

9. The semiconductor light emitting device of claim 1, wherein the electrode pad is disposed adjacent to an edge of the semiconductor stack.

10. A semiconductor light emitting device comprising:
  a semiconductor stack comprising a first semiconductor layer of a first conductivity type, a second semiconductor layer of a second conductivity type opposite to the first conductivity type, an active layer disposed between the first semiconductor layer and the second semiconductor layer, and a through-hole disposed through the semiconductor stack, the semiconductor stack further comprising a first surface and a second surface opposite to the first surface;
  a contact layer connected to the first semiconductor layer, disposed in the through-hole, and disposed through the semiconductor stack;
  a first electrode layer connected to the contact layer; and
  a second electrode layer disposed on the second surface of the semiconductor stack, disposed between the semiconductor stack and the first electrode layer, and insulated from the first electrode layer, the through-hole being disposed through the second electrode layer,
  wherein a first material of the second electrode layer is different from a second material of the second semiconductor layer.

11. The semiconductor light emitting device of claim 10, further comprising a side wall insulating film disposed on a side wall of the through-hole to insulate the contact layer from the second semiconductor layer and the active layer, wherein the contact layer is disposed on the side wall and on the first surface of the semiconductor stack.

12. The semiconductor light emitting device of claim 10, further comprising a transparent electrode connected to the contact layer, and disposed on a substantially entire region of the first surface of the semiconductor stack.

13. The semiconductor light emitting device of claim 10, wherein the second electrode layer comprises a pad forming portion extending from the semiconductor stack, and on which the semiconductor stack is not disposed, and
wherein the semiconductor light emitting device further comprises an electrode pad disposed on the pad forming portion.

14. The semiconductor light emitting device of claim 10, wherein the through-hole comprises a plurality of through holes.

15. A semiconductor light emitting device comprising:
a first electrode layer;
an insulating layer disposed on the first electrode layer;
a second electrode layer disposed on the insulating layer;
a first semiconductor layer of a first conductivity type;
a second semiconductor layer disposed on the second electrode layer, the second semiconductor layer being of a second conductivity type opposite to the first conductivity type;
an active layer disposed between the first semiconductor layer and the second semiconductor layer;
a through-hole disposed through the first semiconductor layer, the active layer, the second semiconductor layer, the second electrode layer, and the insulating layer; and
a contact layer disposed in the through-hole to the first electrode layer,
wherein the through-hole has a first width at a surface of the first semiconductor layer and a second width at the first electrode layer, the second width being narrower than the first width.

16. The semiconductor light emitting device of claim 15, wherein the contact layer is disposed on a portion of the first semiconductor layer.

17. The semiconductor light emitting device of claim 15, further comprising an insulating film disposed on a side wall of the through-hole to the insulating layer,
wherein the contact layer is disposed on the insulating film.

18. The semiconductor light emitting device of claim 15, wherein the second electrode layer comprises a portion on which the second semiconductor layer, the active layer, and the first semiconductor layer are not disposed, and
wherein the semiconductor light emitting device further comprises a pad disposed on the portion.

* * * * *